(12) United States Patent
Gloss et al.

(10) Patent No.: US 10,488,009 B2
(45) Date of Patent: Nov. 26, 2019

(54) MOTOR VEHICLE LAMP (71) Applicant: Varroc Lighting Systems, s.r.o., Senov u Noveho Jicina (CZ)

(72) Inventors: Tomas Gloss, Vitkov (CZ); Milan Stylarek, Mikulcice (CZ); Ludek Mazal, Tisek (CZ)

(73) Assignee: Varroc Lighting Systems, S.R.O., Senov u Noveho (CZ)

( * ) Notice: Subject to any disclaimer, the term of this patent is extended or adjusted under 35 U.S.C. 154(b) by 333 days.

(21) Appl. No.: 15/248,309

(22) Filed: Aug. 26, 2016

(65) Prior Publication Data
US 2017/0059105 A1    Mar. 2, 2017

(30) Foreign Application Priority Data
Aug. 31, 2015  (CZ) .................................. 2015-589

(51) Int. Cl.
*B60Q 1/02* (2006.01)
*F21S 43/19* (2018.01)

(52) U.S. Cl.
CPC .................... *F21S 43/195* (2018.01)

(58) Field of Classification Search
None
See application file for complete search history.

(56) References Cited

U.S. PATENT DOCUMENTS

| | | | | |
|---|---|---|---|---|
| 8,415,880 | B2* | 4/2013 | Choi | ........... C03C 8/24 |
| | | | | 313/512 |
| 2005/0248270 | A1* | 11/2005 | Ghosh | ........... H01L 51/524 |
| | | | | 313/512 |
| 2006/0201181 | A1 | 9/2006 | Bauer et al. | |
| 2008/0284310 | A1* | 11/2008 | Suehiro | ........... H01L 33/56 |
| | | | | 313/498 |
| 2013/0026509 | A1 | 1/2013 | Tohyama et al. | |
| 2014/0056020 | A1 | 2/2014 | Bungenstock et al. | |
| 2014/0209887 | A1 | 7/2014 | Chang | |
| 2015/0023046 | A1 | 1/2015 | Shido et al. | |

FOREIGN PATENT DOCUMENTS

| | | |
|---|---|---|
| CN | 103672715 A | 3/2014 |
| WO | 2012/082194 A1 | 6/2012 |

OTHER PUBLICATIONS

Search Report from Corresponding Czech Application No. PV 2015-589 dated Nov. 26, 2015 (3 pages).

* cited by examiner

*Primary Examiner* — Andrew J Coughlin
(74) *Attorney, Agent, or Firm* — Hovey Williams LLP (57) ABSTRACT

A lamp contains a carrier for mounting of at least one flat light-emitting electroluminescence diode fitted with at least one cathode electric outlet and at least one anode electric outlet for the connection to electric conductors. The carrier includes a carrier body. The electric conductors comprise a cathode circuit an anode circuit, and contacts for the respective connection of the electric outlets of the electroluminescence diode to the cathode circuit and anode circuit. The cathode circuit or the anode circuit is positioned either completely on a surface of the carrier or at least a part of at least one of the cathode circuit or the anode circuit is positioned inside the carrier body and the remaining part of the circuit is positioned on the carrier surface.

20 Claims, 13 Drawing Sheets

MOTOR VEHICLE LAMP

CROSS-REFERENCE TO RELATED APPLICATIONS

This non-provisional patent application claims priority to Czech Patent Application No. PV 2015-589, filed Aug. 31, 2015, entitled "MOTOR VEHICLE LAMP," the entirety of which is herein incorporated by reference into this non-provisional patent application.

BACKGROUND OF THE INVENTION

1. Field of the Invention

The invention relates to a lamp of a motor vehicle, with the lamp comprising a carrier and a light source. The light source comprises at least one flat electroluminescence diode, such as an organic light-emitting diode ("OLED") or a power light-emitting diode ("PLED").

2. Description of the Related Art

Supply of electric power is the basic prerequisite of light emission of indication or lighting devices. Electric power is supplied to the light source through an electrically conductive circuit or by connection of various electric elements. These elements create a conductive path and fulfil the functions that are required from an electric circuit. In the case of power supply to light emitting diode ("LED") sources, the conductive paths are usually incorporated in the printed circuit board ("PCB"). If a conductive path must be formed in the free space, flexible printed circuits are used.

One of the current development trends of vehicle lighting is the effort to distinguish a particular car model or model series from competitors' products. Since the lights are one of the most predominant elements of car appearance, they find themselves in the designers' center of attention, who try to create interesting optical effects and/or try to concentrate different lighting or indicating functions in the same space. If electroluminescent diodes are used, very interesting designer elements can be created and different lighting functions can be combined. However, a power supply must be brought to every electroluminescence diode. The most frequent method of conducting power includes the use of wires that are soldered or glued with a conductive element to the electroluminescence diode in two or more places. If a signaling device is equipped with more OLEDs, a cluster of a great number of wires is formed, which results in a number of disadvantages such as damage of the conductive path, short circuit, difficult assembly etc.

The above mentioned spatial conductive paths for OLEDs are known, e.g., from the documents US2013026509 and US2014209887. A disadvantage of these conductive paths is the fact that the conductive paths are not adapted for lighting devices of motor vehicles where the required optical characteristics must be met for each light function of the lighting device. The available free space in the car body that is designed for the particular lighting device also plays its role.

An aim of certain embodiments of the present invention is to eliminate the above mentioned disadvantages of the existing designs of conductors of light sources, and to ensure the required emissive properties of the lamp within a pre-defined space where some or all the required light functions are provided through flat-shaped electroluminescence diodes mounted on a carrier. A further aim of certain embodiments of the present invention is to provide efficient means to combine light emission by a flat electroluminescence diode and by other light sources, where the entire carrier may contribute to the light emission or to another functional use in a headlight or lamp.

SUMMARY

The disadvantages of the prior art are substantially eliminated by embodiments of the present invention, which may comprise a lamp containing a carrier for mounting of at least one flat light-emitting electroluminescence diode fitted with at least one cathode electric outlet and at least one anode electric outlet for the connection to electric conductors. The carrier includes a carrier body. The electric conductors comprise a cathode circuit and an anode circuit, and contacts for the respective connection of the electric outlets of the electroluminescence diode to the cathode circuit and the anode circuit. The cathode circuit and/or the anode circuit are positioned either completely on the carrier surface or at least a part of at least one of these circuits is positioned inside the carrier body and a remaining part of these circuits is positioned on the carrier surface.

In one of the embodiments of the present invention, the whole cathode circuit and/or the whole anode circuit are positioned in the carrier body.

In one of the embodiments of the present invention, the contacts are advantageously formed in such a way that they contain contact surfaces adapted for abutment of the respective electric outlets of the electroluminescence diode.

In one of the embodiments of the present invention, the at least one flat electroluminescence diode is an OLED.

In one of the embodiments of the present invention, the carrier body comprises a hollow part forming a chamber, with the light unit being installed containing at least one light source. At least one of the light sources may be a LED. In another embodiment the light unit contains just one light source, which is a flat LED.

In another one of the embodiments of the present invention, the light unit contains a reflective element to reflect light emitted by at least one of the light sources. The reflective element may comprise, e.g., a reflector and/or reflective layer applied on the carrier surface.

In another one of the embodiments of the present invention, the light unit contains a refractive element for refraction of light emitted by at least one light source.

In one of the embodiments of the present invention, the lamp contains a fixing element to attach the electroluminescence diodes to the carrier.

In one of the embodiments of the present invention, the cathode circuit or the anode circuit or their part or parts are positioned on the surface of the fixing element or inside the body of the fixing element.

In one of the embodiments of the present invention, one of the cathode circuit and the anode circuit is positioned on/in the carrier body and the other one on/in the fixing element body.

In one of the embodiments of the present invention, the fixing element is a covering mask having the shape of a frame for maintaining the electroluminescence diodes in their position on the carrier and covering the edges of the electroluminescence diodes when the inner space of the lamp is viewed against the emission direction of the lamp.

In another of the embodiments of the present invention, the fixing element is a flat cover between which the carrier and the electroluminescence diodes are positioned. When the inner space of the lamp is viewed against the emission direction of the lamp the layer that is closest to the viewer is the carrier.

In some of the embodiments of the present invention, a pad, e.g., made of rubber, may be positioned between the covering mask and the electroluminescence diodes.

In some of the embodiments of the present invention, a pad, e.g. made of rubber, may be positioned between the flat cover and the electroluminescence diodes.

In another one of the embodiments of the present invention, a pad, e.g. made of rubber, may be positioned between the carrier and the electroluminescence diodes. The pad body can contain at least parts made of an electrically conductive material that make contacts for the electric interconnection of the respective electric outlets of the electroluminescence diode with the cathode circuit and the anode circuit.

In some of the embodiments of the present invention, the fixing element may comprise an adhesive layer comprising, e.g., a both-sided adhesive tape and/or a quick-clamping element, e.g., in the form of a clip.

In another one of the embodiments of the present invention, the carrier and/or covering mask and/or flat cover and/or pad are at least in part made of a light guiding material.

In another one of the embodiments of the present invention, the cathode circuit and/or the anode circuit are positioned in the supporting housing of the lamp, with at least a part of the supporting housing comprising the carrier body.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are clarified in more detail with references to the attached drawings where:

FIG. 1b shows a front view of the lamp from FIG. 1a;

FIG. 2b shows a partial vertical cross-section of the lamp from FIG. 2a;

FIG. 2c shows a schematic view of an arrangement of a cathode and an anode circuit and contacts of the lamp from FIG. 2a;

FIG. 2e shows a schematic front view of a covering mask configured for use in the lamp from FIG. 2a;

FIG. 2f shows a schematic front view of an arrangement of electroluminescence diodes of the lamp from FIG. 2a;

FIG. 4b shows a schematic front view of the lamp from FIG. 4a;

FIG. 4c shows a schematic view of an arrangement of a cathode and anode circuit and contacts of the lamp from FIG. 4a, and FIG. 4d shows a schematic front view of an arrangement of electroluminescence diodes of the lamp from FIG. 4a;

The drawing figures do not limit the present invention to the specific embodiments disclosed and described herein. The drawings are not necessarily to scale, emphasis instead being placed upon clearly illustrating the principles of the invention.

DETAILED DESCRIPTION

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

As used throughout, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Figure 1A:
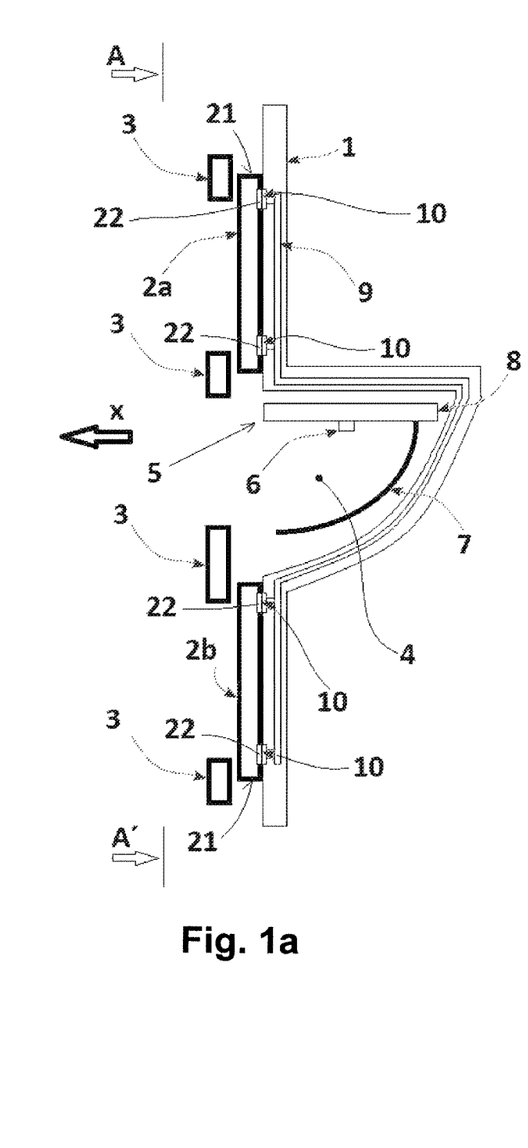
FIG. 1a shows a partial vertical cross-section of a lamp according to embodiments of the present invention, with the lamp comprising a carrier of flat light sources.
Figure 1B:
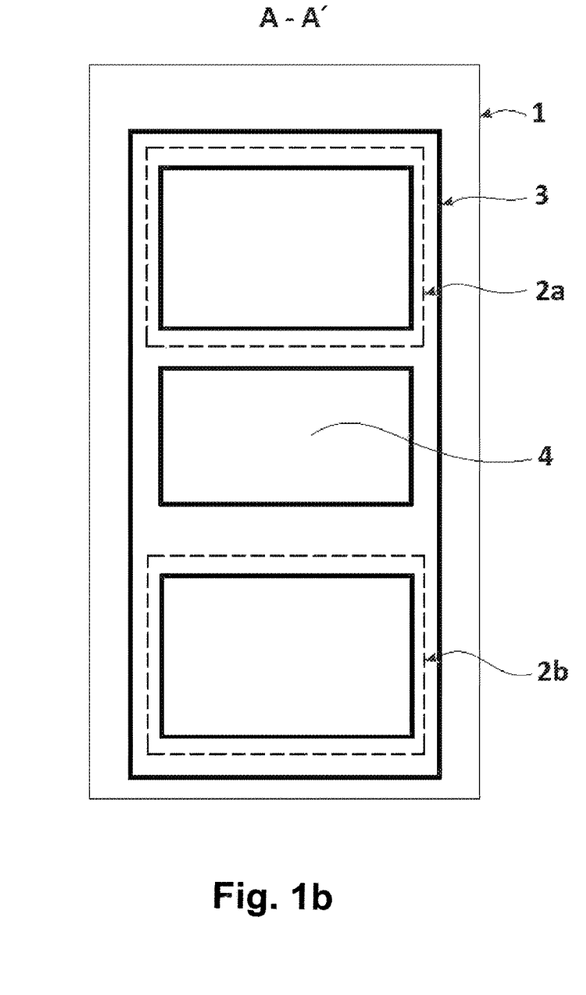

The lamp embodiment shown schematically in FIG. 1 contains an electroluminescence diode 2a, which may be, e.g., a red light emitting diode, and an electroluminescence diode 2b, e.g., a white light emitting diode. These diodes 2a and 2b have a flat shape and at the back side they are attached to a spatially shaped carrier 1. The central part of the carrier 1 includes a bulgy part in which a chamber 4 is provided. The carrier 1 is fitted with conductors 9 for power supply. At the front side, in the direction of the optical axis X in front of the electroluminescence diodes 2a, 2b a covering mask 3 with the shape of a frame is situated, which covers the outer edges 21 of the electroluminescence diodes 2a, 2b from the front view.

The chamber 4 comprises a light unit 5 containing a light source 6 in the form of an LED, a reflector 7, and a supporting plate 8 of the light source 6. At the side adjacent to the electroluminescence diodes 2a, 2b the carrier 1 is equipped with contact surfaces 10 connected to cathode circuit 91 (See FIG. 2a) and anode circuit 92 (See FIG. 2a). These circuits 91 and 92 are part of the electric conductors 9. The electroluminescence diodes 2a, 2b are equipped with electric outlets 22 that touch the contact surfaces 10. FIG. 1b shows a schematic front view of the lamp embodiment from FIG. 1a.

Figure 2A:
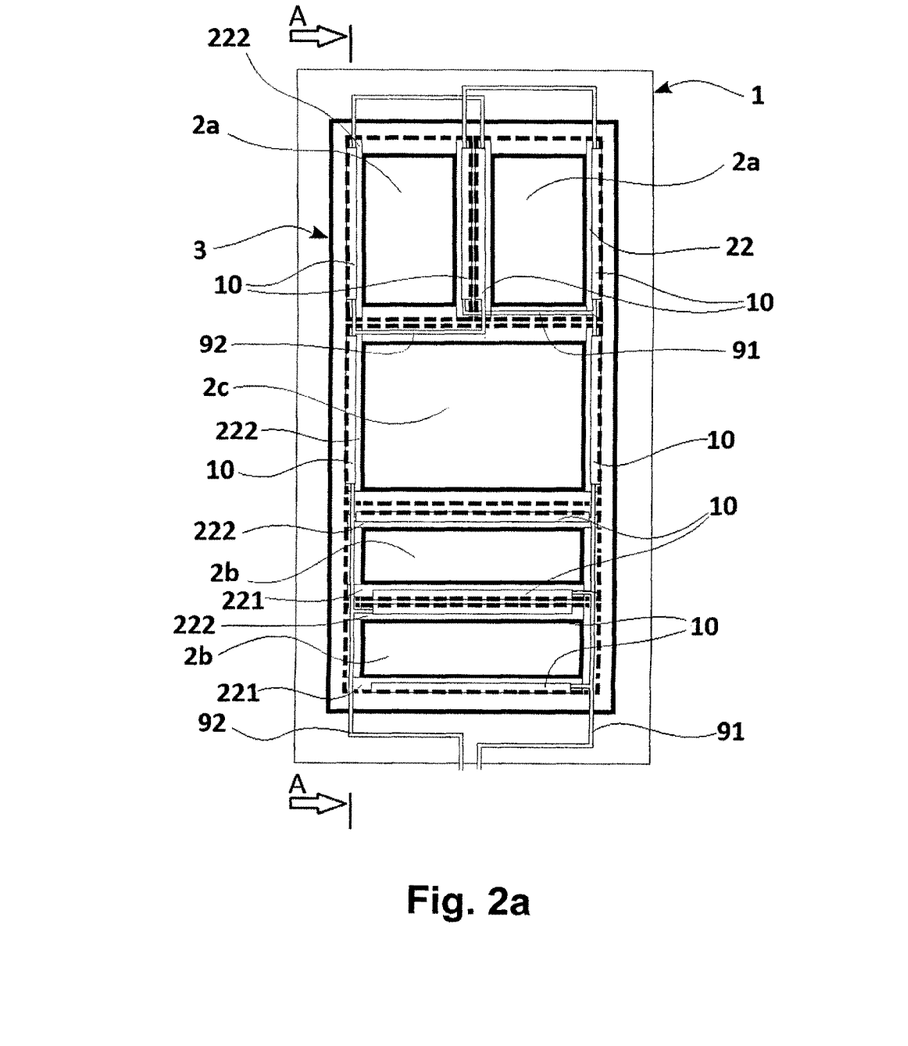
FIG. 2a shows a front view of another lamp according to embodiments of the present invention.
Figure 2B:
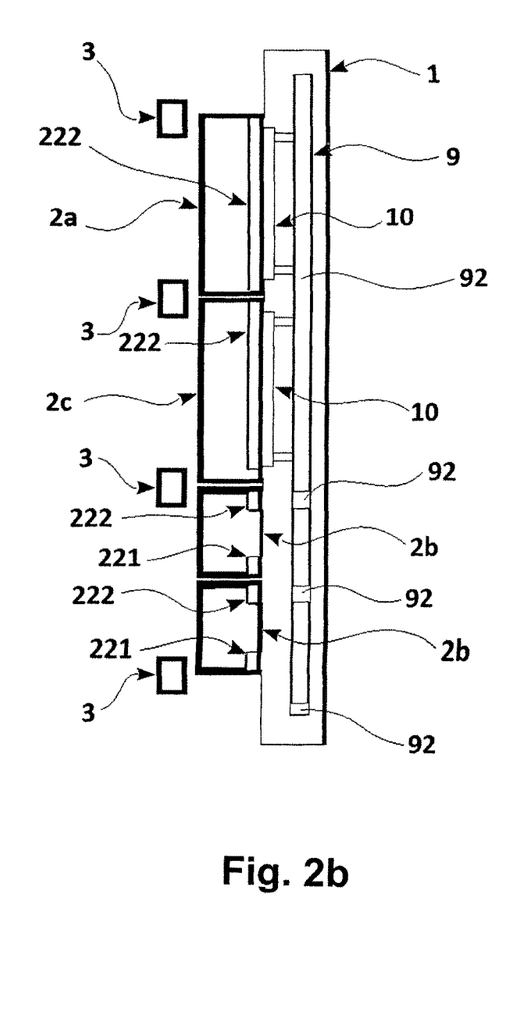

FIGS. 2a to 2f show schematic views of various parts of other embodiments of a lamp according to embodiments of the present invention. With reference to FIG. 2a, the lamp comprises a carrier 1 on which are seated two electroluminescence diodes 2a situated next to each other (e.g., red light emitting diodes), one electroluminescence diode 2c (e.g., amber light emitting diode), and two electroluminescence diodes 2b situated over each other (e.g. white light emitting diodes). FIG. 2b shows a schematic partial vertical cross-section of the lamp embodiment shown in FIG. 2a.

Figure 2C:
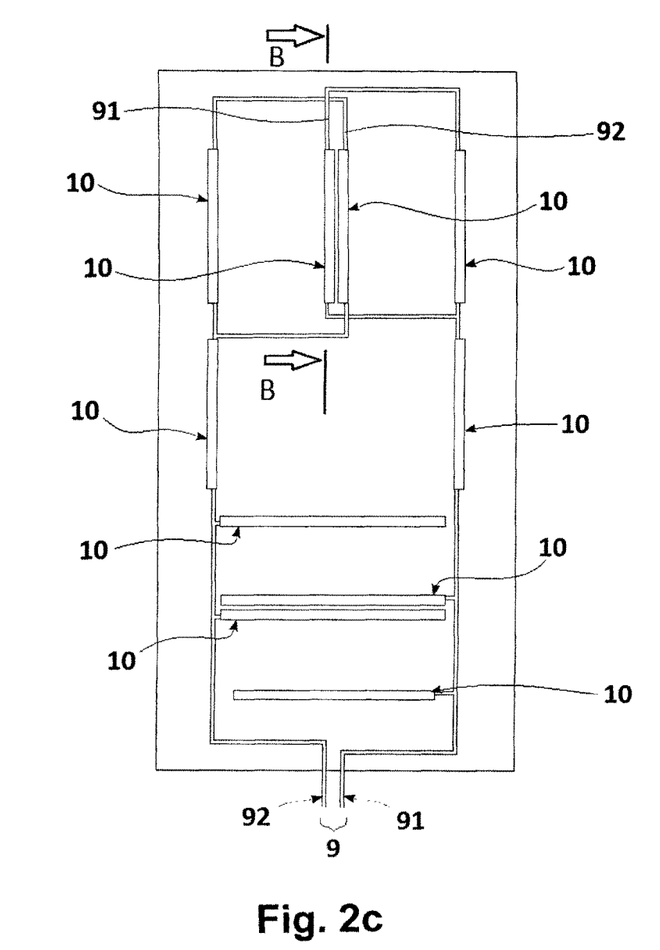
Figure 2D:
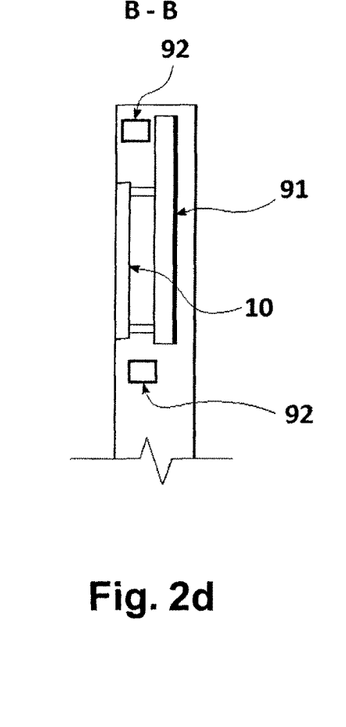
FIG. 2d shows a partial vertical cross-section of the lamp from FIG. 2c.
Figure 2E:
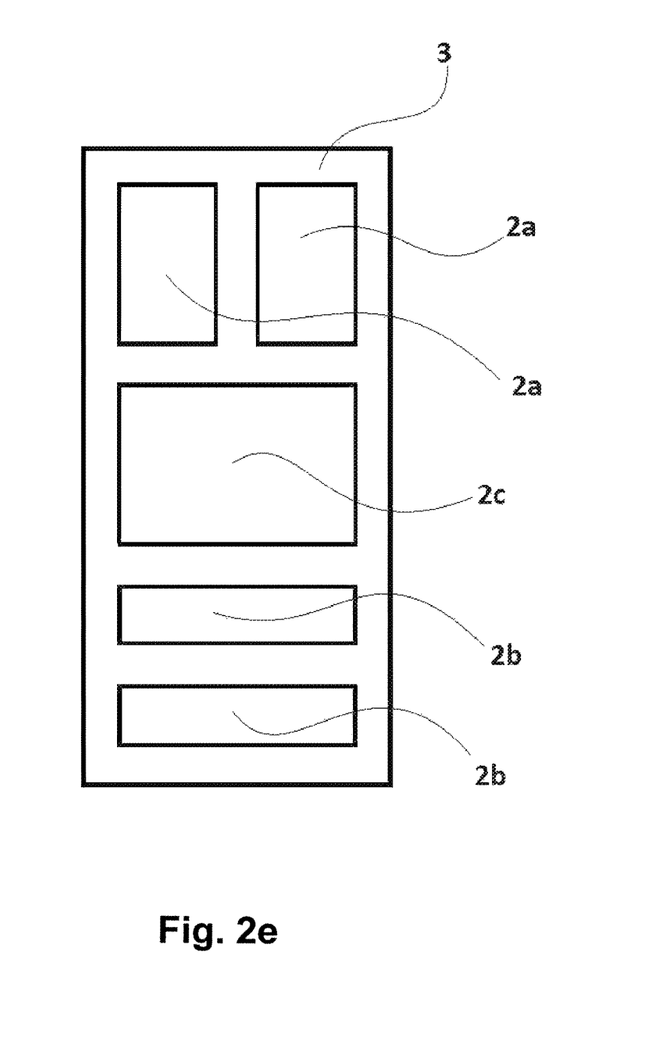
Figure 2F:
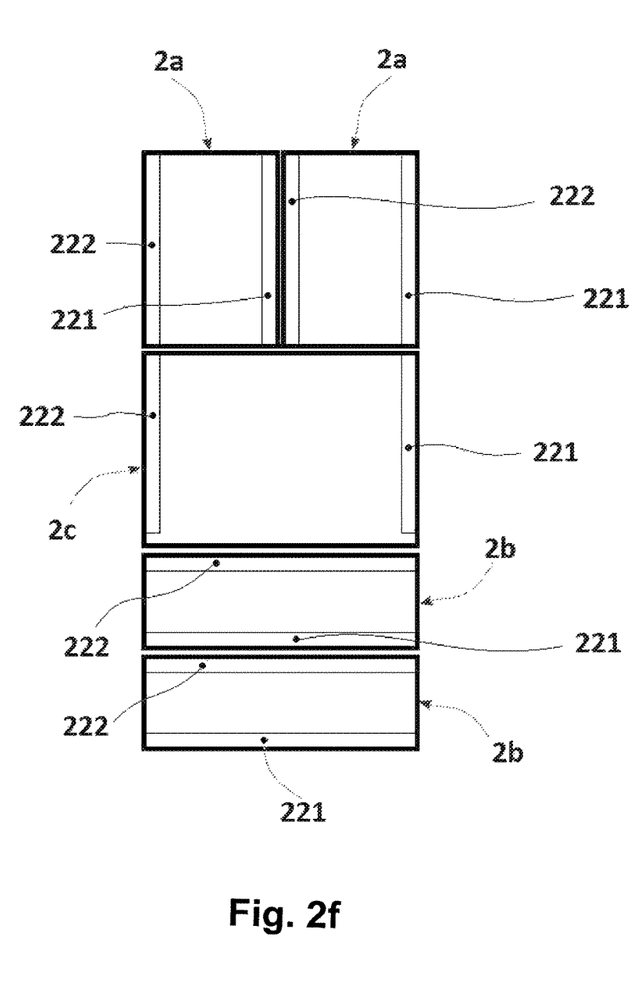

As indicated in FIG. 2f, the electroluminescence diodes 2a, 2b and 2c are fitted with at least cathode electric outlet 221 and at least one anode electric outlet 222. As shown in FIG. 2c, the conductors 9 comprise mutually separated circuits—a cathode circuit 91 and an anode circuit 92. The contact surfaces 10 are situated on the conductors 9 in such a way that negative voltage can be transmitted from the cathode circuit 91 to the cathode electric outlet 221 and positive voltage can be transmitted from the anode circuit 92 to the anode electric outlet 222. FIG. 2d shows a partial vertical cross-section of FIG. 2c, showing a part of the carrier 1 and the mutual arrangement of the circuits 91, 92 and the contact surface 10. FIG. 2e shows a schematic front view of the covering mask 3 designed for use in the lamp from FIG. 2a. The covering mask 3 is applied from the top onto the diodes 2a, 2b and 2c in such a way that it can cover their edges when the lamp is viewed against its emission direction. At the same time the covering mask 3 holds the diodes 2a, 2b and 2c in the proper position on the carrier 1, i.e., in contact with the contact surfaces 10.

Figure 3A:
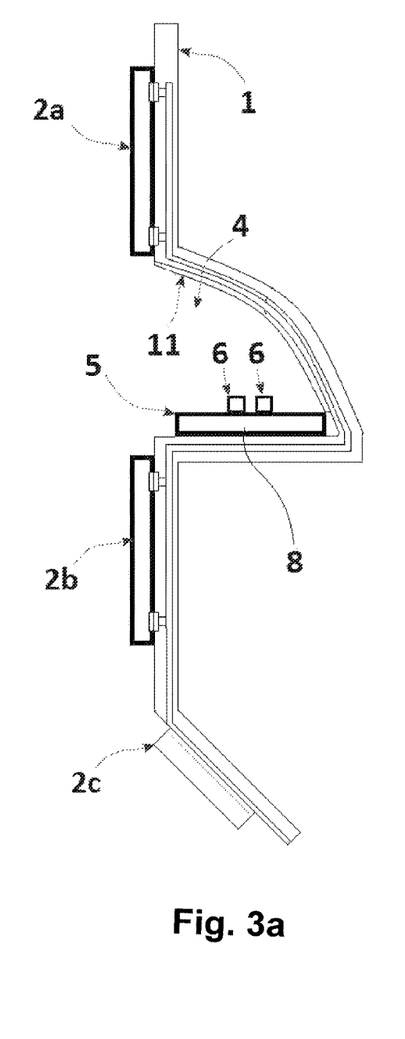
FIG. 3a and FIG. 3b show partial vertical cross-sections of another two lamps of embodiments of the present invention.

FIG. 3a shows another embodiment of a lamp according to embodiments of the present invention. The electroluminescence diodes 2a, 2b are situated on a carrier 1 that is, in the part forming a chamber 4, fitted with a reflective layer 11 for reflection of light rays emitted from the light unit 5 containing two light sources 6 seated on the supporting plate 8.

Figure 3B:
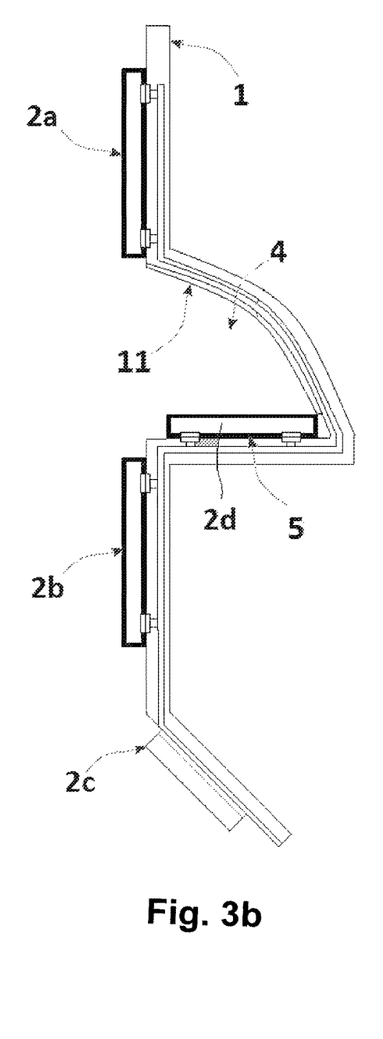

FIG. 3b shows another embodiment of a lamp according to embodiments of the present invention, similar to the embodiment shown in FIG. 3a; however the light unit 5 contains an electroluminescence diode 2d (e.g. amber light emitting diode).

Figure 4A:
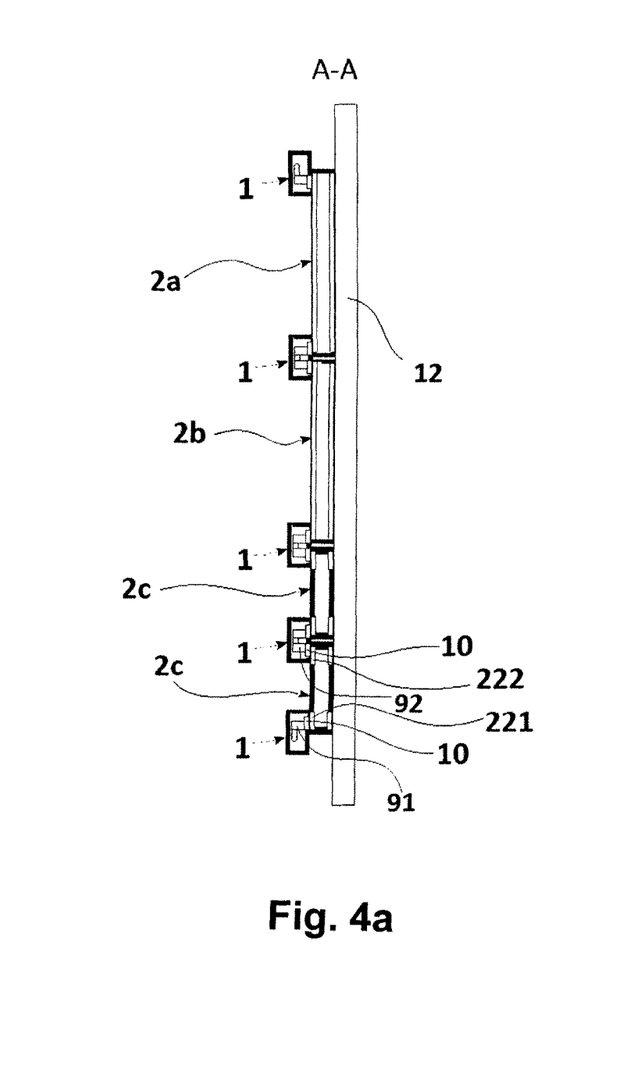
FIG. 4a shows another lamp according to embodiments of the present invention, with a flat cover used to hold electroluminescence diodes.
Figure 4B:
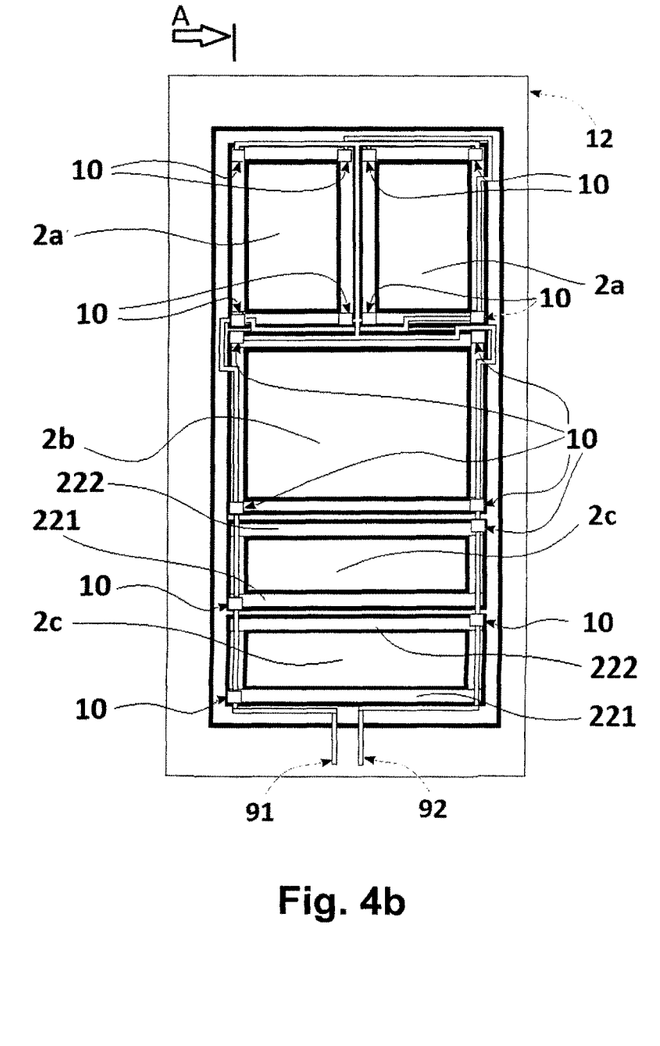
Figure 4C:
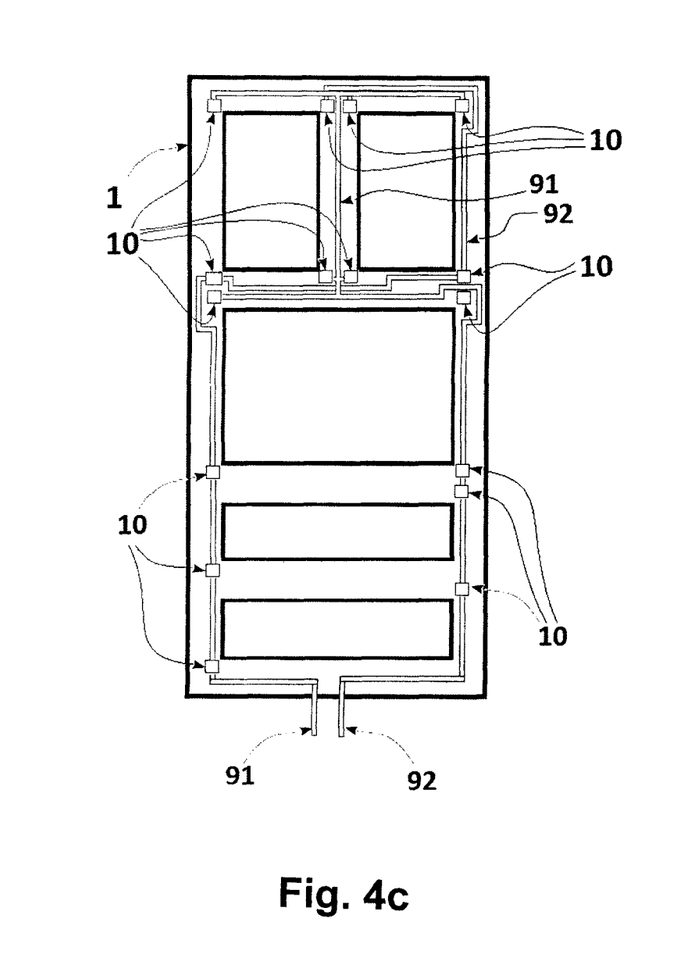
Figure 4D:
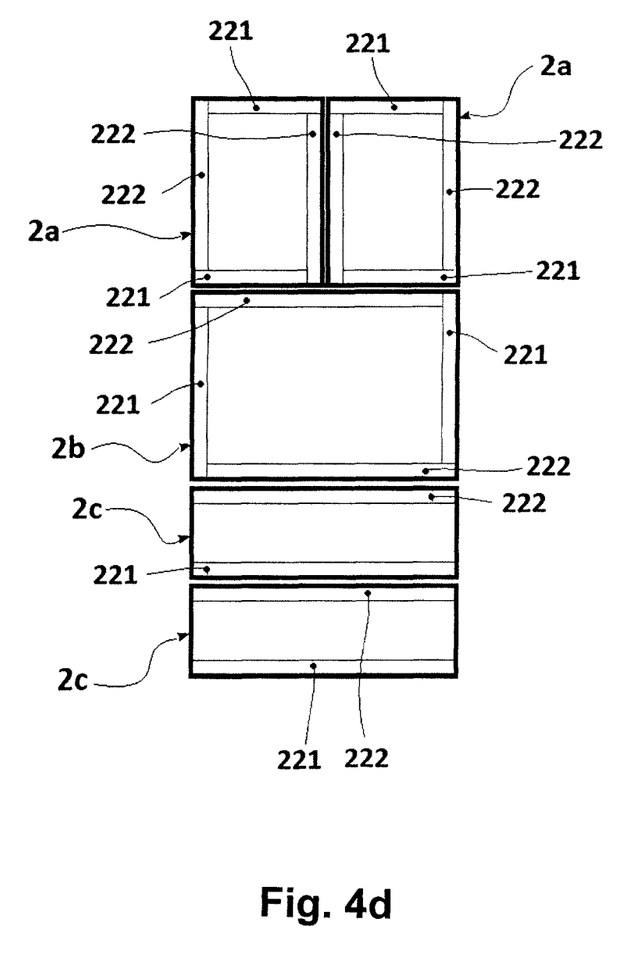

FIGS. 4a through 4d show schematic views of various parts of another lamp according to embodiments of the present invention. In FIG. 4a, the electroluminescence diodes 2a, 2b, 2c are seated from the front side on a carrier 1 fitted with conductors (including cathode circuit 91 and anode circuit 92), which at the same time fulfils the covering function when the inner space of the lamp is viewed. From the rear side, the electroluminescence diodes 2a, 2b, 2c are seated on a cover 12. The contact surfaces 10 are situated on the conductors in such a way that negative voltage can be transmitted from the cathode circuit 91 to the cathode electric outlet 221 and positive voltage can be transmitted from the anode circuit 92 to the anode electric outlet 222 wherein the electroluminescence diodes 2a, 2b are equipped with two cathode electric outlets 221 and two anode electric outlets 222.

Figure 5A:
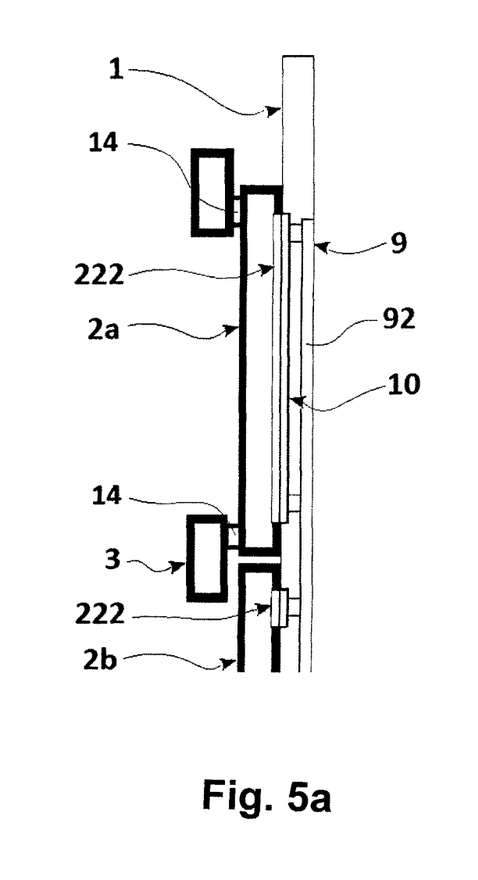
FIGS. 5a, 5b and 5c show schematic views of alternative conductive paths according to embodiments of the present invention.
Figure 5B:
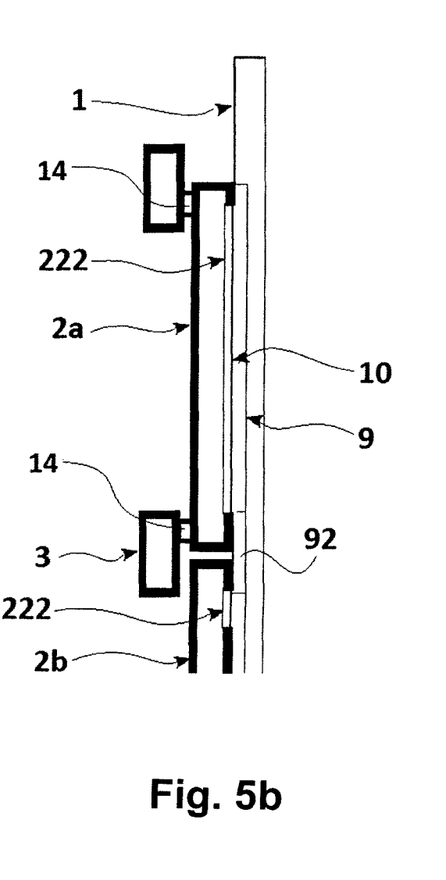
Figure 5C:
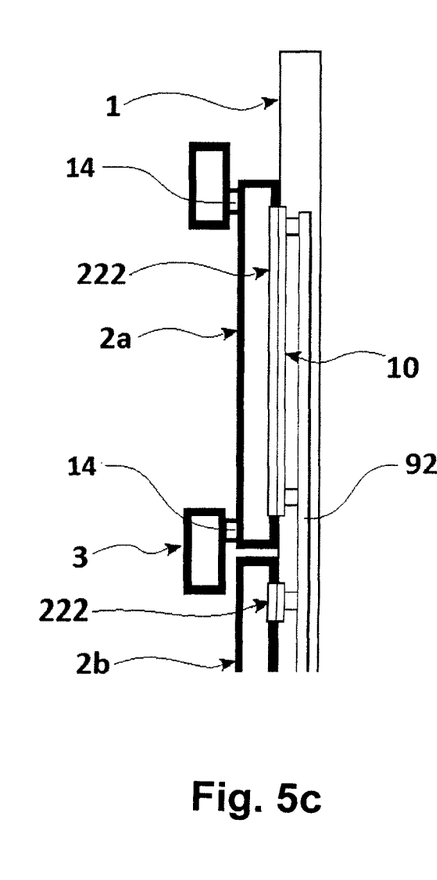

FIGS. 5a, 5b and 5c show alternative embodiments of conductive paths 9 (which may include cathode circuit 91 and anode circuit 92), which may be situated both inside the carrier 1 and at the side adjacent to and/or averted from the electroluminescence diodes 2a, 2b. Between the covering mask 3 and the electroluminescence diodes 2a, a pad 14 is situated. The pad 14 may be made of rubber.

Figure 6A:
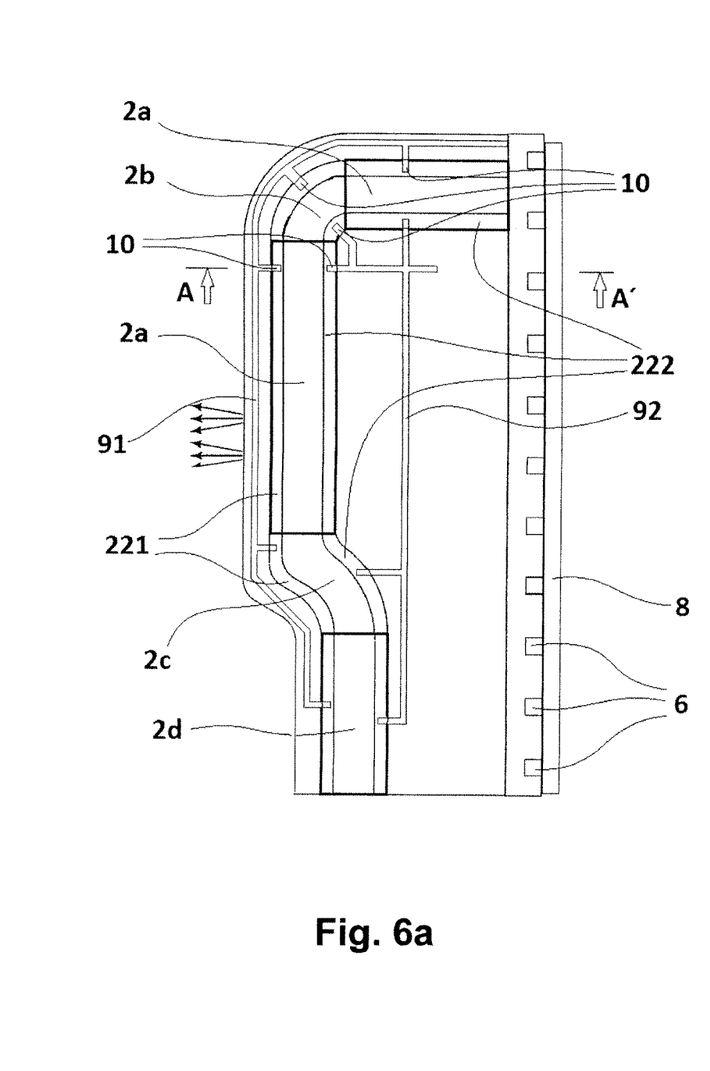
FIGS. 6a and 6b show schematic views of a carrier that is partly or completely made of a light guiding material according to embodiments of the present invention.
Figure 6B:
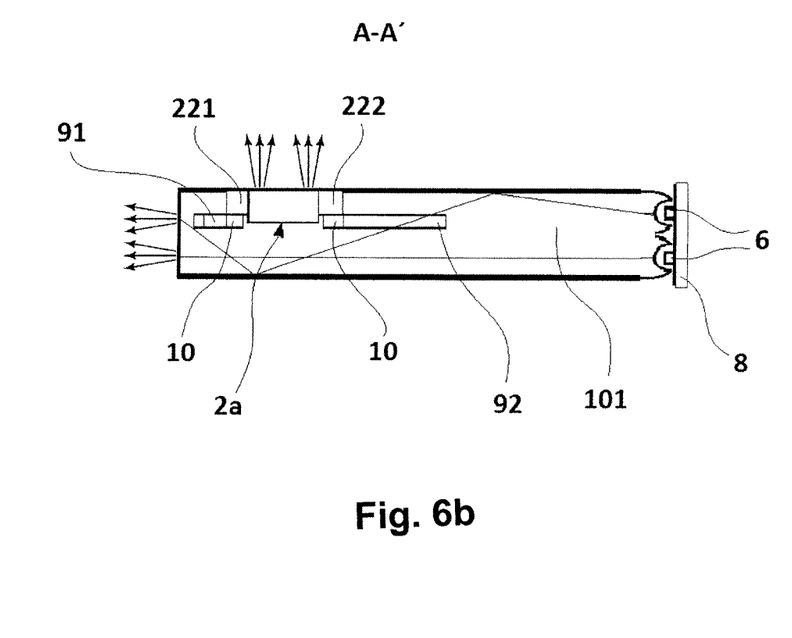

FIGS. 6a and 6b show an embodiment of the carrier 1 that is partly or completely made of a light-guiding material making it possible to guide light in a certain part of the inner space 101 of the carrier 1.

Figure 7:
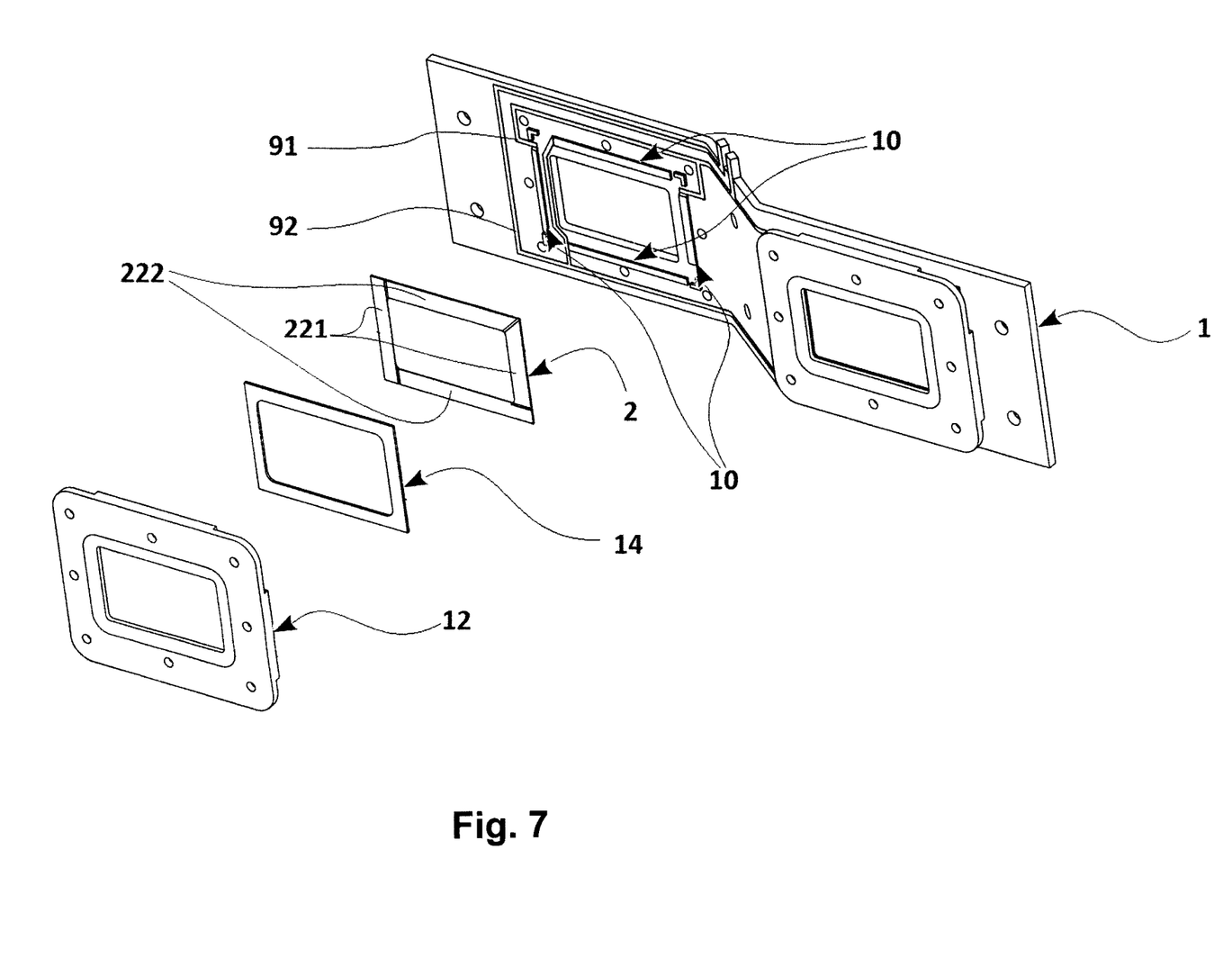
FIG. 7 shows an exploded view of a lamp according to embodiments of the present invention, with a pad for attachment of an electroluminescence diode to a carrier.

FIG. 7 shows an embodiment where the electroluminescence diode 2 is attached to the carrier 1 by means of a pad 14 and frame 12, with the contact surfaces 10 situated on the carrier 1 adapted for contact of the respective electric outlets 221, 222 with the electroluminescence diode 2.

Figure 8A:
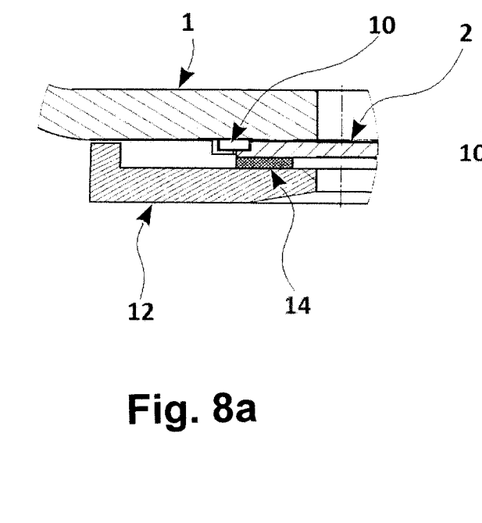
FIG. 8a shows a schematic view of a lamp according to embodiments of the present invention, with an elastic pad positioned between a flat cover and an electroluminescence diode.

FIG. 8a shows a schematic view of an embodiment where between the flat cover 12 and the electroluminescence diode 2 an elastic pad 14 is situated. The elastic pad 14 may be made of rubber. Instead of, or in addition to, the pad 14, an adhesive layer can be used comprising, e.g., of a both-sided adhesive tape and/or a quick-clamping element may be used comprising, e.g., a clip.

Figure 8B:
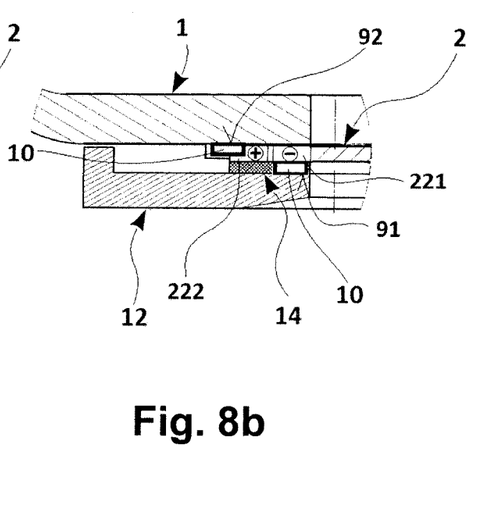
FIG. 8b shows a schematic view of a lamp according to embodiments of the present invention, with a fixing element, in the form of a flat cover, comprising a cathode cover, a carrier, and an anode cover.

FIG. 8b shows an embodiment where a fixing element in the form of a flat cover 12 enables transmission of only negative voltage from the cathode circuit 91 via the contact surface 10 to the cathode electric outlet 221, and the carrier 1 conversely enables transmission of only positive voltage from the anode circuit 92 via a different contact surface 10 to the anode electric outlet 222. Between the flat cover 12 and the electroluminescence diode 2 an elastic pad 14 or another element is advantageously situated—e.g. a both-sided adhesive tape—comprising a fixing element together with the flat cover 12.

Figure 8C:
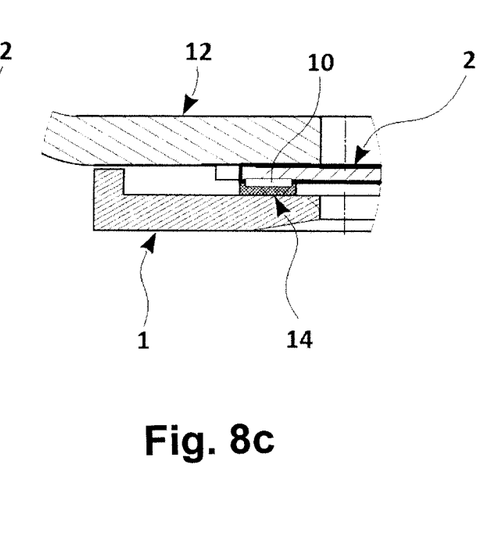
FIG. 8c shows a schematic view of a lamp according to embodiments of the present invention, with a pad at least partly made of an electrically conductive material.

FIG. 8c shows an embodiment where the pad 14 is situated between the carrier 1 and the electroluminescence diode 2 where the pad body 14 contains a part or parts made of an electrically conductive material, which together with the contact surface 10 make a contact for electric interconnection of the respective electric outlet of the shown electroluminescence diode 2 with the cathode or anode circuit.

Figure 9:
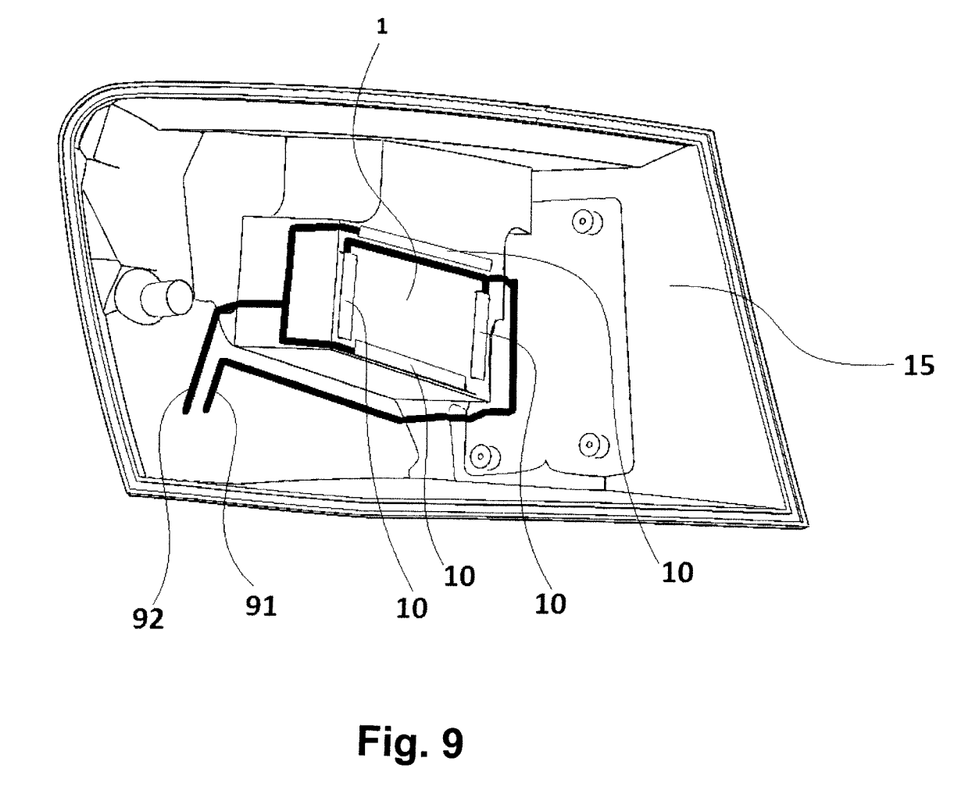
FIG. 9 shows a schematic view of a cathode circuit and an anode circuit integrated in a supporting housing of a lamp according to embodiments of the present invention.

FIG. 9 shows an embodiment wherein the conductor 9 comprises the cathode circuit 91 and anode circuit 92, which are integrated in the supporting housing 15 of the lamp. A part of the supporting housing 15 where the contact surfaces 10 are situated forms a carrier 1 to ensure a stable position of the electroluminescence diode 2, which is not shown here.

Figure 10:
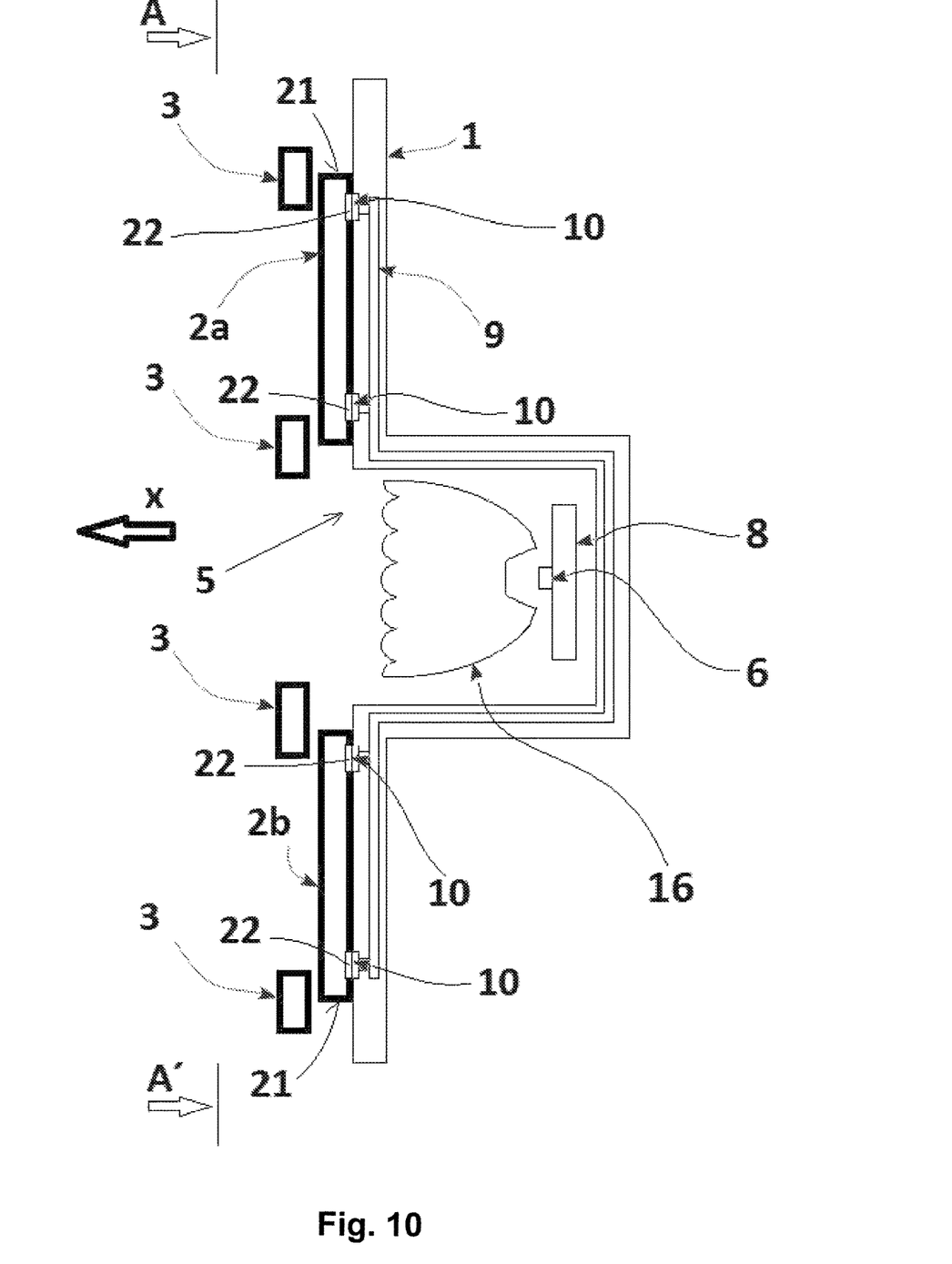
FIG. 10 shows a schematic view of a light unit containing a refractive element for ensuring refraction of light emitted by a light source.

FIG. 10 shows an embodiment where the light unit 5 contains a refractive element 16 enabling refraction of light emitted by the light source 6.

LIST OF REFERENCE MARKS

1—carrier
101—inner space 2, 2a, 2b, 2c, 2d—electroluminescence diode
21—edge
221—cathode electric outlet
222—anode electric outlet
3—covering mask
4—chamber
5—light unit
6—light source
7—reflector
8—supporting plate
9—conductor
91—cathode circuit
92—anode circuit
10—contact surface
11—reflective layer
12—flat cover
14—pad
15—supporting housing of the lamp
16—refractive element Although the invention has been described with reference to the embodiments illustrated in the attached drawing figures, it is noted that equivalents may be employed and substitutions made herein without departing from the scope of the invention as recited in the claims.

The invention claimed is:

1. A lamp of a motor vehicle containing:
   (a) at least two flat light-emitting electroluminescence diodes comprising a first electroluminescence diode and a second electroluminescence diode, wherein the first electroluminescence diode comprises at least one first cathode electric outlet and at least one first anode electric outlet, wherein the second electroluminescence diode comprises at least one second cathode electric outlet and at least one second anode electric outlet;
   (b) at least one electric conductor separate from the first electroluminescence diode and the second electroluminescence diode, wherein the electric conductor comprises a cathode circuit, an anode circuit, first contacts for connecting sections of the cathode circuit to the first cathode electric outlet and the second cathode electric outlet, and second contacts for connecting sections of the anode circuit to the first anode electric outlet and second anode electric outlet;
   (c) a carrier comprising a carrier body for mounting the electroluminescence diodes, wherein the sections of the cathode circuit that contact the first contacts are positioned on a surface of the carrier and/or inside the carrier body, wherein the sections of the anode circuit that contact the second contacts are positioned on a surface of the carrier and/or inside the carrier body; and
   (d) fixing element for attachment of the electroluminescence diodes to the carrier, wherein the fixing element comprises (i) a covering mask formed in the shape of a frame for holding the electroluminescence diodes in their position on the carrier and for covering edges of the electroluminescence diodes or (ii) a flat cover, wherein the electroluminescence diodes are positioned between the flat cover and the carrier when the fixing element comprises the flat cover.

2. The lamp in accordance with claim 1, wherein the cathode circuit or the anode circuit are situated completely in the carrier body.

3. The lamp in accordance with claim 1, wherein the first contacts include contact surfaces adapted to touch the first cathode electric outlet and the second cathode electric outlet and the second contacts include contact surfaces adapted to touch the first anode electric outlet and the second anode electric outlet.

4. The lamp in accordance with claim 1, wherein said electroluminescence diodes comprise an organic light-emitting diode.

5. The lamp in accordance with claim 1, wherein the carrier body comprises a bulgy part forming a chamber that includes a light unit comprising at least one light source.

6. The lamp in accordance with claim 5, wherein the at least one the light source comprises a light-emitting diode.

7. The lamp in accordance with claim 5, wherein the light unit includes a reflective element for reflection of light emitted from the at least one light source and/or a refractive element for refraction of light emitted from the at least one light source.

8. The lamp in accordance with claim 1, wherein the carrier is, at least partially, made of a light guiding material.

9. The lamp in accordance with claim 1, wherein the cathode circuit or the anode circuit is situated in a supporting housing, wherein at least a part of the supporting housing forms the carrier body.

10. A lamp of a motor vehicle containing:
   (a) at least two flat light-emitting electroluminescence diodes comprising a first electroluminescence diode and a second electroluminescence diode, wherein the first electroluminescence diode comprises at least one first cathode electric outlet and at least one first anode electric outlet, wherein the second electroluminescence diode comprises at least one second cathode electric outlet and at least one second anode electric outlet;
   (b) at least one electric conductor separate from the first electroluminescence diode and the second electroluminescence diode, wherein the electric conductor comprises a cathode circuit, an anode circuit, first contacts for connecting sections of the cathode circuit to the first cathode electric outlet and the second cathode electric outlet, and second contacts for connecting sections of the anode circuit to the first anode electric outlet and second anode electric outlet; and
   (c) a carrier comprising a carrier body for mounting the electroluminescence diodes,
   wherein the sections of the cathode circuit that contact the first contacts are positioned on a surface of the carrier and/or inside the carrier body,
   wherein the sections of the anode circuit that contact the second contacts are positioned on a surface of the carrier and/or inside the carrier body,
   wherein a rubber pad is situated between the carrier and the electroluminescence diodes.

11. The lamp in accordance with claim 10, wherein the cathode circuit or the anode circuit are situated completely in the carrier body.

12. The lamp in accordance with claim 10, wherein the first contacts include contact surfaces adapted to touch the first cathode electric outlet and the second cathode electric outlet and the second contacts include contact surfaces adapted to touch the first anode electric outlet and the second anode electric outlet.

13. The lamp in accordance with claim 10, wherein said electroluminescence diodes comprise an organic light-emitting diode.

14. The lamp in accordance with claim 10, wherein the carrier body comprises a bulgy part forming a chamber that includes a light unit comprising at least one light source.

15. The lamp in accordance with claim 14, wherein the at least one the light source comprises a light-emitting diode.

16. The lamp in accordance with claim 14, wherein the light unit includes a reflective element for reflection of light emitted from the at least one light source and/or a refractive element for refraction of light emitted from the at least one light source.

17. The lamp in accordance with claim 10, further comprising a fixing element for attachment of the electroluminescence diodes to the carrier, the fixing element comprising:
   (i) a covering mask formed in the shape of a frame for holding the electroluminescence diodes in their position on the carrier and for covering edges of the electroluminescence diodes, or
   (ii) a flat cover, wherein the electroluminescence diodes are positioned between the flat cover and the carrier when the fixing element comprises the flat cover.

18. The lamp in accordance with claim 10, wherein the rubber pad includes a portion made of an electrically conductive material, so as to form electric interconnection between the first cathode electric outlet, the second cathode electric outlet, the first anode electric outlet, and the second anode electric outlet with the cathode circuit and the anode circuit.

19. The lamp in accordance with claim 10, wherein the carrier is, at least partially, made of a light guiding material.

20. The lamp in accordance with claim 10, wherein the cathode circuit or the anode circuit is situated in a supporting housing, wherein at least a part of the supporting housing forms the carrier body.

\* \* \* \* \*